(12) United States Patent
Hunter et al.

(10) Patent No.: US 8,134,401 B2
(45) Date of Patent: Mar. 13, 2012

(54) SYSTEMS AND METHODS OF LOW OFFSET SWITCHED CAPACITOR COMPARATORS

(75) Inventors: Bradford Lawrence Hunter, Spicewood, TX (US); Wallace Edward Matthews, Austin, TX (US)

(73) Assignee: Texas Instruments Incorported, Dallas, TX (US)

( * ) Notice: Subject to any disclaimer, the term of this patent is extended or adjusted under 35 U.S.C. 154(b) by 68 days.

(21) Appl. No.: 12/729,066

(22) Filed: Mar. 22, 2010

(65) Prior Publication Data
US 2011/0089977 A1    Apr. 21, 2011

Related U.S. Application Data

(60) Provisional application No. 61/251,812, filed on Oct. 15, 2009.

(51) Int. Cl.
*G06F 7/64* (2006.01)
*G06G 7/18* (2006.01)
*G06G 7/19* (2006.01)

(52) U.S. Cl. ........... 327/337; 327/65; 327/552; 327/554

(58) Field of Classification Search .................. 327/337, 327/552, 554
See application file for complete search history.

(56) References Cited

U.S. PATENT DOCUMENTS

| 5,028,815 A * | 7/1991 | Van De Plassche | 327/65 |
| 7,679,422 B1 * | 3/2010 | Thiagarajan et al. | 327/337 |
| 7,834,786 B2 * | 11/2010 | Kawahito et al. | 341/120 |

* cited by examiner

*Primary Examiner* — Lincoln Donovan
*Assistant Examiner* — John Poos
(74) *Attorney, Agent, or Firm* — Alan A. R. Cooper; Wade James Brady, III; Frederick J. Telecky, Jr.

(57) ABSTRACT

The disclosed systems and methods of low offset switched capacitor comparator reduce settling errors. The system operates in two major phases. During a first phase, the input voltage is sampled on the input capacitors and a differential amplifier is configured in a unity gain configuration to sample the amplifier offset. During the second phase, the input voltage difference is amplified at the output of the comparator. The amplifier transient sampling error is reduced by shorting the outputs of the differential amplifier for a shorting period at the start of the second phase. A clocked comparator at the output of the differential amplifier provides a fast comparison using internal positive feedback. The differential amplifier should have developed sufficient differential output voltage to overcome the offset of the clocked comparator.

20 Claims, 4 Drawing Sheets

SYSTEMS AND METHODS OF LOW OFFSET SWITCHED CAPACITOR COMPARATORS

CROSS-REFERENCE TO RELATED APPLICATION

This application claims benefit to U.S. provisional patent application Ser. No. 61/251,812, filed on Oct. 15, 2009, which is incorporated by reference herein.

TECHNICAL FIELD

The present disclosure is generally related to electronics and, more particularly, is related to voltage comparators.

BACKGROUND

Offset compensated comparators are often used in analog to digital converters (ADCs). This is especially true for multi-bit ADCs where the comparator offset needs to be tightly controlled. One possible scheme is to connect these comparators to the driving (previous stage) amplifier through series switches. These switches are opened periodically to isolate the comparators. During this time the comparator inputs are shorted and the offset cancellation phase takes place. If the pre-amplifier in the comparator is configured in unity gain feedback, the offset is stored in the series capacitors connected at the input of the pre-amplifier. This is called input offset correction.

A typical prior art offset compensated comparator is shown in FIG. 1. Offset compensated comparator 120 is connected to a driving (previous stage) amplifier 122 through series switches 124 and 125. Offset compensated comparator 120 includes switches 124-129; comparator preamplifier 130; capacitors 132 and 134; parasitic capacitances 136 and 138; latch 140; inputs $V_{INP}$ and $V_{INM}$; reference voltages $V_{REFP}$ and $V_{REFM}$; latched bit 142; and latch enable 144. The previous stage amplifier 122 includes switches 150-160; amplifier 162; and capacitors 164-167.

For the prior art scheme shown in FIG. 1, the voltage at the input of pre-amplifier 130 is given by:

$$V_{PRE-INP} - V_{PRE-INM} = [C_S/(C_S+C_P)][(V_{INP}-V_{INM}) - (V_{REFP}-V_{REFM})]$$

where $V_{PRE-INP}$ is the voltage at node $N_1$; $V_{PRE-INM}$ is the voltage at node $N_2$; $C_S$ is the capacitance of capacitors 132 and 134; and $C_P$ is the parasitic capacitances 136 and 138 at the input of preamplifier 130. The input to the latch 140 is the input of preamplifier 130 multiplied by the gain of preamplifier 130.

Assuming that the offset of preamplifier 130 is completely removed by this scheme, the overall offset of the comparator 120 is then $$\text{OFFSET} = \text{OFFSET}_{LATCH}/[\text{GAIN}_{PRE-AMP}(C_S/(C_S+C_P))]$$

where $\text{OFFSET}_{LATCH}$ is the offset of latch 140, and $\text{GAIN}_{PRE-AMP}$ is the gain of preamplifier 130.

VREFP and VREFM often have different output impedances. VREFP might be generated from a reference voltage buffer circuit and VREFM might be connected directly to ground. The AC settling of these two signals (onto capacitors 132 and 134) will be substantially different, where VREFM would settle quickly to ground and VREFP would settle more slowly to the positively generated reference.

SUMMARY

Example embodiments of the present disclosure provide systems and methods of low offset switched capacitor comparators. Briefly described, in architecture, one example embodiment of the system, among others, can be implemented as follows: a clocked comparator with a switched capacitor input stage; a clocked amplifier with differential outputs electrically connected between the switched capacitor input stage and inputs to the clocked comparator; and a switch electrically connected across the differential outputs of the clocked amplifier and across the inputs to the clocked comparator, the switch configured to short the inputs of the clocked comparator during a settling period of the switched capacitor input stage.

Embodiments of the present disclosure can also be viewed as providing methods of low offset switched capacitor comparators. In this regard, one embodiment of such a method, among others, can be broadly summarized by the following: sampling a first input of a differential input voltage with a plurality of switched input capacitors and a clocked amplifier with differential outputs; sampling a reference voltage with the clocked amplifier; sampling a second input of the differential input voltage with the clocked amplifier to generate the differential input voltage; shorting the differential outputs of the clocked amplifier during a settling period of the plurality of switched input capacitors; releasing the differential outputs of the clocked amplifier to develop an amplified differential that indicates a state of a relationship of the sampled differential input voltage with respect to the sampled reference voltage; comparing an output voltage of the clocked amplifier with a clocked comparator to produce an indication of an outcome; and transmitting the indication of the outcome of the comparing step.

DETAILED DESCRIPTION

Figure 1:
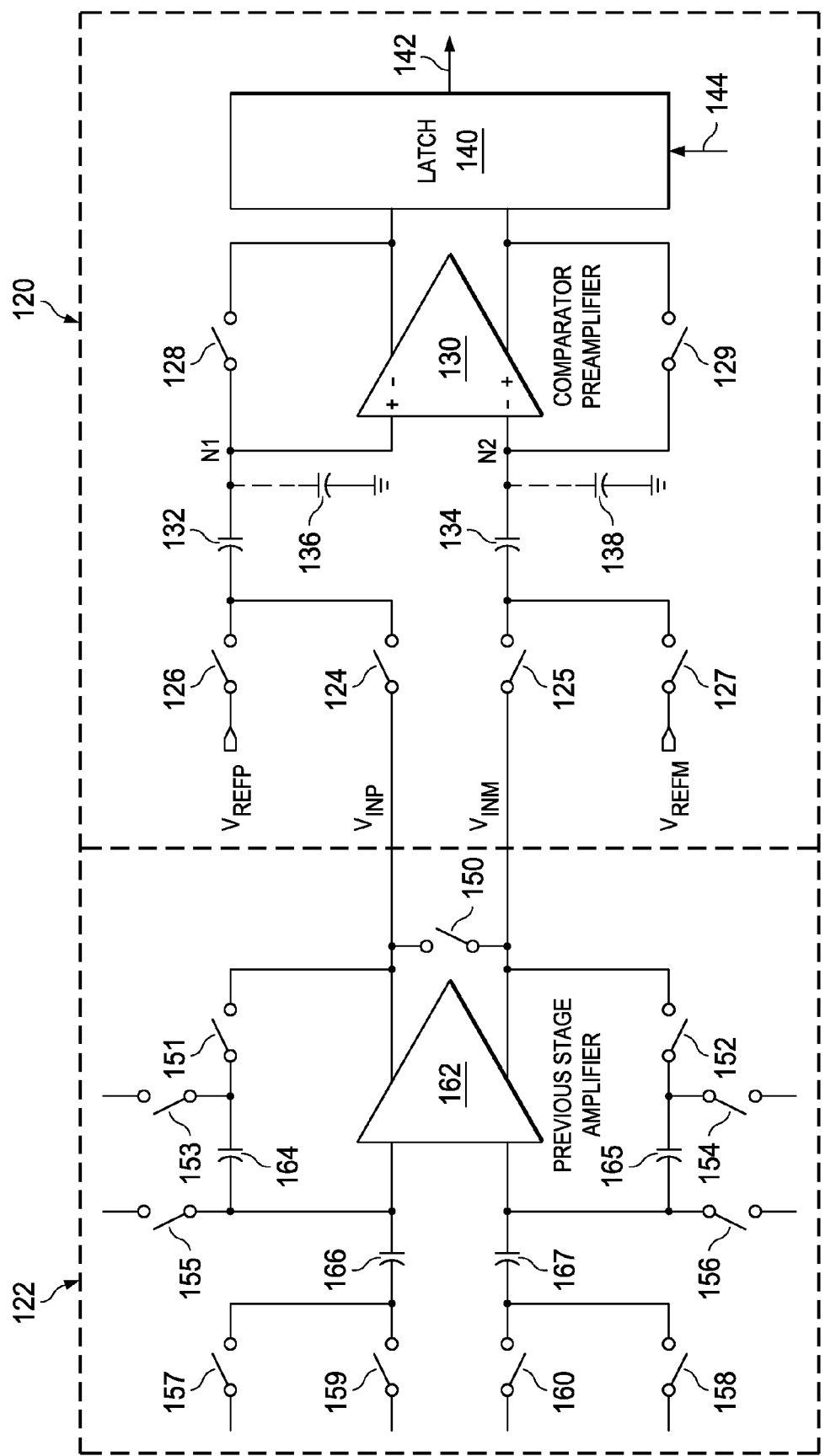
FIG. 1 is a circuit diagram of an example embodiment of a prior art switched capacitor comparator.

Embodiments of the present disclosure will be described more fully hereinafter with reference to the accompanying drawings in which like numerals represent like elements throughout the several figures, and in which example embodiments are shown. Embodiments of the claims may, however, be embodied in many different forms and should not be construed as limited to the embodiments set forth herein. The examples set forth herein are non-limiting examples and are merely examples among other possible examples.

Embodiments of the present disclosure provide systems and methods of low offset switched capacitor comparators. Continuous time comparators have built-in offset voltages arising from random process variations. Decreasing the built-in offset voltage in the device itself leads to an increase in device area that is a linear function of the square foot of the device area. Increasing the device are may lead to increase power consumption and increased propagation delay. Switched capacitor comparators provide the ability to automatically cancel comparator input offset voltages.

Sources of offset and settling error for switched capacitor comparators: an offset in the sampling phase, and transient settling disturbances. The sampled offset appears at the output of the comparator and is compensated for in the comparison phase. At the start of the comparison phase, the comparator input stage experiences transient settling disturbances that can generate a transient settling error at the output of the comparator. The transient settling disturbance generally arises from the difference in impedance in the differential sampled input voltage sources.

For example, with a differential reference voltage, the positive side of the reference is generally generated from a medium impedance voltage source, such as a buffer amplifier. The negative side of the reference is generally a ground reference that is low impedance. This difference in impedances creates a difference in the voltage settling time on the input reference capacitors. The difference in settling times creates a momentary large or small signal transient error at the input to the voltage comparator until all input voltages are fully settled. The momentary transient error voltage generates an output transient error voltage with a gain factor (where the gain factor depends on the frequency content of the disturbance).

The disclosed systems and methods of low offset switched capacitor comparator reduce the settling error. The system operates in two major phases. During a first phase, the input voltage is sampled on the input capacitors and the comparator (a differential amplifier in an example embodiment) is configured in a unity gain configuration to sample the comparator offset. During the second phase, the input voltage difference is amplified at the output of the comparator. The settling error may be reduced by shorting the outputs of the differential amplifier for a shorting period at the start of the second phase. If, in an example embodiment, the differential amplifier is composed of multiple stages, each stage is preferably shorted together during the shorting period. A clocked comparator at the output of the differential amplifier may provide a fast comparison using internal positive feedback in an example embodiment. The differential amplifier should have developed sufficient differential output voltage to overcome the offset of the clocked comparator.

Figure 2:
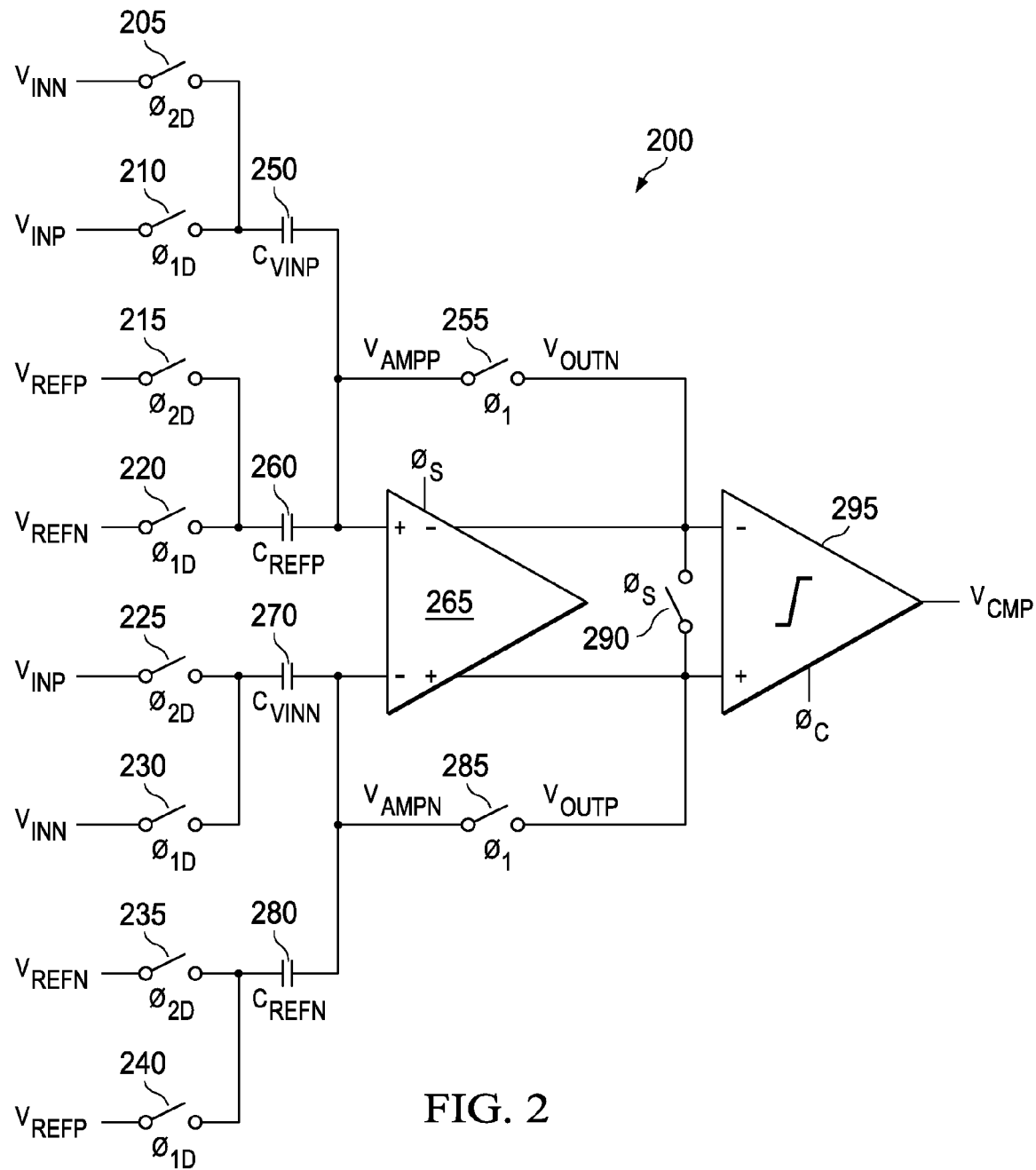
FIG. 2 is a circuit diagram of an example embodiment of a system of low offset switched capacitor comparator.

FIG. 2 provides an example embodiment of such systems and methods. Circuit 200 is an example embodiment of a voltage comparator with low offset. It may be an auto-zeroed comparator. Circuit 200 is fully differential which allows the rejection of power supply noise because the power supply noise is common mode noise.

The designs of FIG. 1 and FIG. 2 are distinct and solve different circuit problems. First, the design of FIG. 1 has an additional amplifier from the circuit in FIG. 2. Additionally, amplifier 130 in FIG. 1 is not a clocked amplifier. The differential input voltage in FIG. 1 is presented to common capacitors 166 and 167 through switches 157, 159, 160 and 158. Amplifier 162 generates a common mode voltage for the input voltages present on switches 157, 159, 160, and 158. Conversely, the circuit of FIG. 2 uses a discrete pair of $V_{REF}$ capacitors 260, 280 and a discrete pair of input capacitors 250, 270. The circuit of FIG. 2 does not translate the common mode voltage—the sampling is performed based on the raw differential voltage. The circuit of FIG. 2 uses additional capacitors, but one less amplifier, compared to the circuit of FIG. 1.

FIG. 2 creates an arbitrary scaling between the reference voltage and the input voltage using $C_{REFP}$ 260 and $C_{VINP}$ 250. In an example embodiment, the ratio of capacitor 260 and capacitor 250 may be adjusted to scale to a desired level. The circuit of FIG. 1 doesn't have the ability to scale using the capacitors. The circuit of FIG. 1 has a single capacitor 132 that is shared between $V_{REFP}$ and $V_{INP}$. The scaling function in FIG. 1 uses previous stage amplifier 162 through capacitors 166 and 153 and drives stage 120 with a high gain.

An example non-limiting application using the circuit of FIG. 2 may use ten comparators, each of which has a different ratio, each of which may be tuned. The capacitor ratio of each may be changed using switches. If the circuit of FIG. 1 were to be used in the same application with 10 comparators, an additional amplifier would be used for each comparator. However, in the circuit of FIG. 2, each comparator uses a different ratio of capacitors. The circuit of FIG. 2 senses arbitrary common mode voltages and performs arbitrary scaling in a single stage. Circuit 200 performs scaling by adjusting the ratio of capacitor 260 to capacitor 250 and the ratio of capacitor 280 to capacitor 270. By configuring them in this manner, circuit 200 operates independent of common mode voltage. Conversely, in FIG. 1, amplifier stage 120 requires a common mode voltage that is between $V_{REFP}$ and $V_{REFM}$.

An example embodiment of circuit 200 includes a differential input voltage and a differential reference voltage. In an example embodiment, $V_{REFN}$ may be ground and $V_{REFP}$ may be a positive reference voltage supplied by a non-limiting example of a buffered band gap reference. $V_{INNP}$ is the positive side of a differential input voltage and $V_{INN}$ is the negative side of the differential input voltage. An example embodiment of circuit 200 may also include a network of switches including switches 205, 210, 215, 220, 225, 230, 235, and 240. An example embodiment of circuit 200 may also include sampling capacitors 250, 260, 270, and 280. An example embodiment of circuit 200 may also include switches 255, 285, and 290 (in the network of switches), operational amplifier 265, and comparator 295. In an example embodiment of circuit 200, one or more components may be clocked, including operational amplifier 265; switches 205, 210, 215, 220, 225, 230, 235, and 240; switches 255, 285, and 290, and comparator 295.

The differential configuration of an example embodiment allows the rejection of switching noises such as charge injection and clock feed-through, because the circuit compares the differential between the inputs. An example embodiment of circuit 200 operates in two phases, $\Phi_1$ and $\Phi_2$. $\Phi_{1D}$ is a delayed version of $\Phi_1$ and $\Phi_{2D}$ is a delayed version of $\Phi_2$. So it just operates in two phases.

In an example embodiment, each switch 205-240 is assigned a various clock phase. The positive input of amplifier 265, $V_{AMPP}$, is connected to the negative output of amplifier 265, $V_{OUTN}$, and the negative input of amplifier 265, $V_{AMPN}$ is connected to the positive output of amplifier 265, $V_{OUTP}$, during the $\Phi_1$ phase. During the $\Phi_1$ phase, switches 255 and 285 are closed which essentially shorts $V_{AMPP}$ to $V_{OUTN}$ and $V_{AMPN}$ to $V_{OUTP}$. $\Phi_C$ is a clock for comparator 295. Clocked comparator 295 may have positive feedback to perform a very fast comparison. The high speed may lead to a high offset.

In an example embodiment, comparator 265 may be an analog comparator or an analog operational amplifier. Operational amplifier 265 preferably generates enough differential at the end of the $\Phi_2$ phase to overcome the offset of the comparator 295. As a non-limiting example, if the offset voltage of comparator 295 is 50 mV, operational amplifier 265 should generate 100 mV at the output of operational amplifier 265 to robustly cancel out this offset. Clock comparator 295 may resolve a full 1 or a full 0, rail to rail, very quickly from the 100 mV generated from operational amplifier 265. So it takes a very small differential and converts it very quickly using positive feedback to a 1 or a 0. But clock comparator 295 has high offset. So $\Phi_C$, which may be, as a non-limiting example, a pulse clock, controls clock comparator 265, which may be very fast.

Figure 3:
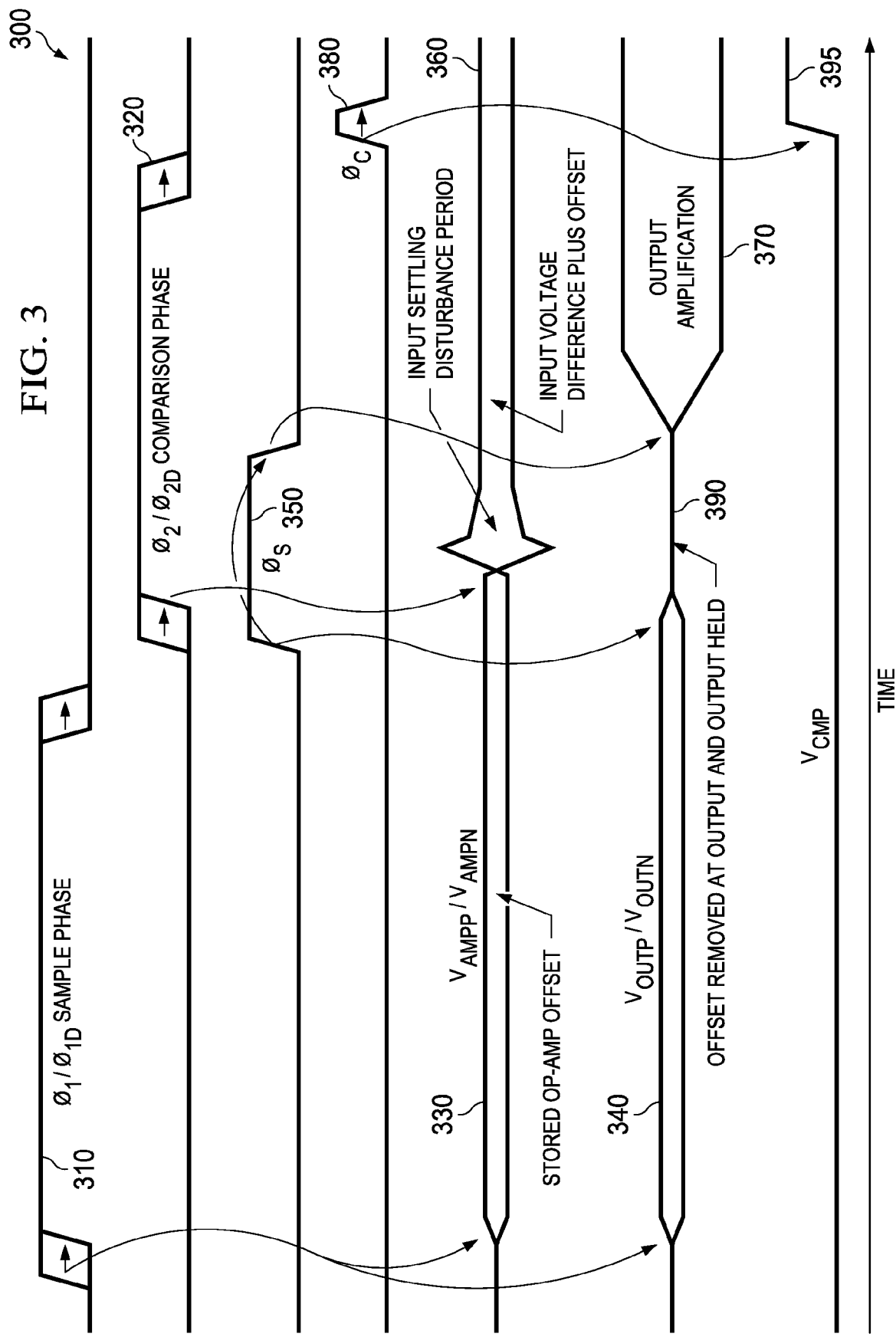
FIG. 3 is a timing diagram of an example embodiment of the switched capacitor comparator of FIG. 2.

FIG. 3 provides an example embodiment of timing diagram 300 of the operation of circuit 200 of FIG. 2. Timing diagram 300 includes clock phases $\Phi_1$ and $\Phi_{1D}$ 310, $\Phi_2$ and $\Phi_{2D}$ 320, $\Phi_S$ 350, and $\Phi_C$ 380. In this example embodiment, $\Phi_1$ and $\Phi_{1D}$ 310 is a sample phase in which an input voltage is sampled; $\Phi_2$ and $\Phi_{2D}$ 320 is a comparison phase in which the input voltage is compared to a reference voltage; $\Phi_S$ 350 is a switch phase in which the amplifier outputs are shorted; and $\Phi_C$ 380 is an output phase in which the comparator output is enabled. $\Phi_{1D}$ and $\Phi_{2D}$ are delayed versions of $\Phi_1$ and $\Phi_2$ respectively. The clock in timing diagram 300 is shown as a 2 phase clock. However, other embodiments include a 3 phase clock and a 4 phase clock. In an embodiment with a four phase clock, one phase may be used for $\Phi_1$, one phase for $\Phi_S$, and two phases for $\Phi_2$. In an embodiment with a three phase clock, one phase may be used for $\Phi_1$, one phase for $\Phi_S$, and one phase for $\Phi_2$.

Sample acquisition in the example embodiment of FIG. 3 is based on sample phase 310 in which $\Phi_1$ switches 255 and 285 and $\Phi_{1D}$ switches 210, 220, 230, and 240 are closed. In this condition, operational amplifier 265 has the positive input shorted to the negative output and the negative input shorted to the positive output, essentially storing its own offset in unity gain mode. The differential offset between $V_{OUTP}$ and $V_{OUTN}$ is now stored as an offset at the output of operational amplifier 265.

In $\Phi_1$ phase 310, $\Phi_1$ switches 255 and 285 are closed—$V_{OUTN}$ is shorted to $V_{AMPP}$ and $V_{OUTP}$ is shorted to $V_{AMPN}$. Now operational amplifier 265 is in a unity gain configuration and storing its own differential offset voltage. The differential operational amplifier 265 preferably has some common mode feedback. If the inputs are shorted together and there is no common mode feedback, the outputs would be indeterminate. The differential voltage is preferably biased by a common mode voltage. Differential operational amplifier 265 in the circuit is being driven by a common mode amplifier (not shown) that sets the common mode voltage of $V_{OUTn}$ and $V_{OUTP}$. $V_{OUTN}$ and $V_{OUTP}$, driven to the common mode voltage are now storing the differential offset of operational amplifier 265.

At the same time that $\Phi_1$ switches 255 and 285 are closed, $\Phi_{1D}$ switches 210, 220, 230, and 240, are closed. $\Phi_{1D}$ switches 210, 220, 230, and 240 connect capacitors $C_{VINP}$ 250 to $V_{INP}$, $C_{REFP}$ 260 to $V_{REFN}$, $C_{VINN}$ 270 to $V_{INN}$ and $C_{REFN}$ 280 to $V_{REFP}$. Capacitors 250, 260, 270, and 280 are all now shorted to the input voltages. In $\Phi_1$ phase 310 clocked comparator 295 is not active. It is not active until $\Phi_C$ pulse 380. $\Phi_S$ phase 350 is also not active during $\Phi_1$ phase 310. Switched capacitors 250, 260, 270, and 280 are charged by sampling one half of the input. The differential offset voltage of operational amplifier 265 is loaded onto the inputs to comparator 295. The offset voltage of operational amplifier 265 is stored at the input to operational amplifier 265 during timing period 330. The offset voltage of operational amplifier 265 is also held at the output of operational amplifier 265 during timing period 340. The offset voltage present during timing period 340 is not desirable and will be removed during the timing period 390, which is during $\Phi_S$ phase 350.

Moving into $\Phi_2$ phase 320, $\Phi_{1D}$ switches 210, 220, 230, and 240 and $\Phi_1$ switches 255 and 285 all open. In an example embodiment, the $\Phi_1$ and $\Phi_2$ phases are not overlapping. Once the switches open the offset is now in two places—on the input to operational amplifier 265 and on the output of operational amplifier 265. On the input to operational amplifier 265, the offset is beneficial. When $\Phi_{2D}$ switches 205, 215, 225, and 235 close, the left hand side of capacitors 250, 260, 270, and 280 transition from $V_{INN}$ to $V_{INP}$, from $V_{REFN}$ to $V_{REFP}$, from $V_{INP}$ to $V_{INN}$, and from $V_{REFP}$ to $V_{REFN}$ respectively. The differential charge injected into capacitor $C_{VINP}$ 250 will equal $C_{VINP} \times (V_{INN} - V_{INP})$ and the differential charge injected into capacitor $C_{VINN}$ 270 will equal $C_{VINN} \times (V_{INP} - V_{INN})$.

The differential reference will inject charge into capacitor $C_{REFP}$, the charge being equal to $C_{REFP} \times (V_{REFP} - V_{REFN})$. The differential reference will also inject charge into capacitor $C_{REFN}$, the charge being equal to $C_{REFN} \times (V_{REFN} - V_{REFP})$. So there are two charges present at $V_{AMPP}$—the charge associated with the differential reference (difference between $V_{REFP}$ and $V_{REFN}$) and the charge associated with the differential sampled voltage (difference between $V_{INP}$ and $V_{INN}$). If capacitors $C_{VINP}$ 250 and $C_{REFP}$ 260 are perfectly equal, that is, $C_{VINP}$ 250=$C_{REFP}$ 260, then when the two voltages are equal, $V_{AMPP}$ and $V_{AMPN}$ don't transition. The voltage on $V_{AMPN}$ becomes equalized when $V_{INP} - V_{INN} = (V_{REFP} - V_{REFN})$. So for example, let $V_{INP} - V_{INN} = 1V$ and let's say $V_{REFP} - V_{REFN} = 1V$. Then in that circumstance, the voltage on $V_{AMPP}$ should not change because there are two equal capacitors and they both transition equal and opposite charges.

During $\Phi_S$ phase 350, the input sides of capacitors 250, 260, 270, and 280 will be transitioning from VINP to VINN, from VREFN to VREFP, from VINN to VINP, and from VREFP to VREFN respectively. The $\Phi_S$ signal may remain asserted until the capacitor input voltages have settled substantially to the final voltage values or sufficiently as to minimize the effective transient disturbance induced settling error at the output of operational amplifier 265. Once sufficient settling of the input capacitor voltages has occurred, $\Phi_S$ phase 350 ends and clocked amplifier 265 is no longer shorted internally and at the output. When $\Phi_S$ phase 350 ends, the input voltage difference plus the offset is present at the input of operational amplifier 265 during period 360. During $\Phi_S$ phase 350, the undesired offset voltage at the output of operational amplifier 265 sampled during period 340 is removed during period 390, which occurs during $\Phi_S$ phase 350.

The input difference voltage present during period 360 is amplified by operational amplifier 265 during period 370. $\Phi_C$ phase 380 then occurs in which clocked comparator 295 is latched. The latch event triggers an update to $V_{CMP}$ 395. VCMP 395 now reflects a full 1 or full 0 indication of whether $(V_{INP} - V_{INN})$ is greater than or less than $(V_{REFP} - V_{REFN})$.

Figure 4:
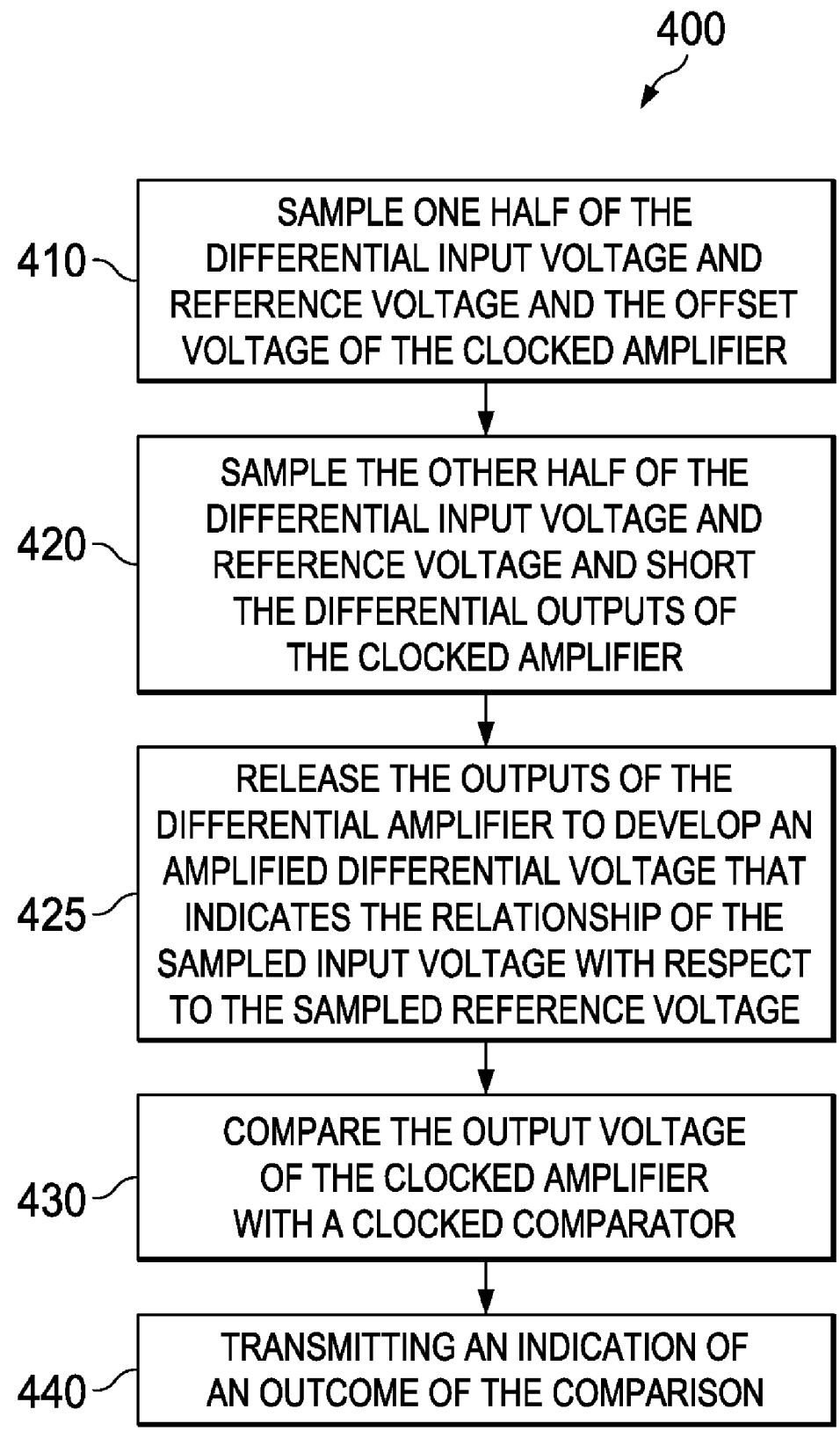
FIG. 4 is a flow diagram of an example embodiment of a method of low offset switched capacitor comparator.

FIG. 4 provides flowchart 400 of an example embodiment of a method of low offset switched capacitor comparator. In block 410, one half of the differential input voltage and reference voltage is sampled with a clocked amplifier with differential outputs and the offset voltage of the clocked amplifier is sampled. In block 420, the other half of the differential input voltage and reference voltage are sampled and the differential outputs of the clocked amplifier are shorted. In block 425, the outputs of the differential amplifier are released to develop an amplified differential that indicates the relationship of the sampled input voltage with respect to the sampled reference voltage. In block 430, the output of the clocked amplifier is compared using a clocked comparator. In block 440, an indication of the output of the clocked comparator is transmitted.

Therefore, at least the following is claimed:
1. A system comprising:
a network of switches;
a network of capacitors electrically connected to the network of switches, the network of capacitors and network of switches configured to sample an input voltage;
a clocked amplifier electrically connected to the network of capacitors, the clocked amplifier having differential outputs configured to sample the input voltage applied to the network of capacitors;
a clocked comparator electrically connected to the clocked amplifier, the clocked comparator having inputs configured to compare the differential outputs of the clocked amplifier; and a shorting switch electrically connected across the differential outputs of the clocked amplifier and across the inputs of the clocked comparator, the shorting switch configured to
short the inputs of the clocked comparator during a settling period of the network of capacitors;
wherein inputs of the clocked amplifier are configured to be shorted to outputs of the clocked amplifier during a first clock phase.

2. The system of claim 1, further comprising a first switch electrically connected between a positive output of the clocked amplifier and a negative input of the clocked amplifier and a second switch electrically connected between a negative output of the clocked amplifier and a positive input of the clocked amplifier.

3. The system of claim 1, wherein the network of switches comprises:
a first set of switches configured to electrically connect a differential input voltage to the network of capacitors;
a second set of switches configured to electrically connect an inverse of the differential input to the network of capacitors; and
a third set of switches configured to electrically connect at least one input of the clocked amplifier to at least one output of the clocked amplifier,
wherein the first set of switches are clocked at a delay from a clocking of the third set of switches.

4. The system of claim 3, wherein the first set of switches and second set of switches are not closed concurrently.

5. The system of claim 3, wherein the shorting switch is closed during a period in which the first set of switches is open and the second set of switches is closed.

6. The system of claim 3, wherein the network of capacitors is configured to sample a first half of an input voltage during a first clock phase and to sample a second half of an input voltage during a second clock phase.

7. The system of claim 1, wherein the clocked comparator is configured to output during a comparator clock pulse, the comparator clock pulse occurring after a sampling period and a settling error reduction period.

8. A system comprising:
a clocked comparator with a switched capacitor input stage;
a clocked amplifier with differential outputs electrically connected between the switched capacitor input stage and inputs to the clocked comparator; and
a switch electrically connected across the differential outputs of the clocked amplifier and across the inputs to the clocked comparator, the switch configured to short the inputs of the clocked comparator during a settling period of the switched capacitor input stage,
wherein the clocked amplifier is configured to sample an input voltage and during a sample phase, the switch configured to be open during the sample phase.

9. The system of claim 8, wherein the switch is configured to close during a comparison phase.

10. The system of claim 9, wherein the clocked comparator is configured to be enabled after the comparison phase.

11. The system of claim 9, wherein inputs of the clocked amplifier are configured to be shorted to outputs of the clocked amplifier during a first clock phase.

12. The system of claim 8, wherein an output of the clocked comparator is configured to be enabled with a comparator clock pulse.

13. The system of claim 8, wherein the comparator clock pulse is configured to transition to an ON state when a comparison phase is configured to transition to an OFF state.

14. A method comprising:
sampling a first input of a differential input voltage with a plurality of switched input capacitors and a clocked amplifier with differential outputs;
sampling a reference voltage with the clocked amplifier;
sampling a second input of the differential input voltage with the clocked amplifier to generate the differential input voltage;
shorting the differential outputs of the clocked amplifier during a settling period of the plurality of switched input capacitors;
releasing the differential outputs of the clocked amplifier to develop an amplified differential that indicates a state of a relationship of the sampled differential input voltage with respect to the sampled reference voltage;
comparing an output voltage of the clocked amplifier with a clocked comparator to produce an indication of an outcome; and
transmitting the indication of the outcome of the comparing step.

15. The method of claim 14, further comprising enabling an output of the clocked comparator after the comparing step.

16. The method of claim 14, further comprising clocking the clocked comparator with a pulse clock.

17. The method of claim 14, wherein a settling error of the clocked amplifier is reduced during the shorting step.

18. The method of claim 14, wherein the sampling of the first input occurs during a first clock phase and the sampling of the second input occurs during a second clock phase.

19. A system, comprising:
a network of switches;
a network of capacitors electrically connected to the network of switches, the network of capacitors and network of switches configured to sample an input voltage;
a clocked amplifier electrically connected to the network of capacitors, the clocked amplifier having differential outputs configured to sample the input voltage applied to the network of capacitors;
a clocked comparator electrically connected to the clocked amplifier, the clocked comparator having inputs configured to compare the differential outputs of the clocked amplifier; and
a shorting switch electrically connected across the differential outputs of the clocked amplifier and across the inputs of the clocked comparator, the shorting switch configured to short the inputs of the clocked comparator during a settling period of the network of capacitors, wherein the switched capacitors are comprise a switched capacitor input stage,
wherein the clocked amplifier is further configured to sample an input voltage and during a sample phase, the shorting switch is configured to be open during the sample phase,
wherein the shorting switch is configured to close during a comparison phase; and
wherein inputs of the clocked amplifier are configured to be shorted to outputs of the clocked amplifier during a first clock phase.

20. The system of claim 19, further comprising a first switch electrically connected between a positive output of the clocked amplifier and a negative input of the clocked amplifier and a second switch electrically connected between a negative output of the clocked amplifier and a positive input of the clocked amplifier.

* * * * *